United States Patent
Yeh (10) Patent No.: US 8,350,637 B2
(45) Date of Patent: Jan. 8, 2013

(54) CIRCUIT SUBSTRATE INCLUDING A PLURALITY OF SIGNAL LINES AND GROUND LINES FORMING A 3-D GROUNDING CIRCUIT LOOP

(75) Inventor: Ting-Hao Yeh, Hsinchu County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 287 days.

(21) Appl. No.: 12/760,557

(22) Filed: Apr. 15, 2010

(65) Prior Publication Data

US 2011/0199165 A1  Aug. 18, 2011

(30) Foreign Application Priority Data

Feb. 12, 2010  (TW) .............................. 99104792 A (51) Int. Cl.
H01P 3/08  (2006.01)
(52) U.S. Cl. ................................. 333/1; 333/5
(58) Field of Classification Search ............ 333/1, 4, 333/5, 238, 246
See application file for complete search history.

(56) References Cited

U.S. PATENT DOCUMENTS

| 6,249,047 B1 * | 6/2001 | Corisis ......................... 257/691 |
| 7,154,353 B2 * | 12/2006 | Dohata .............................. 333/1 |
| 2008/0088007 A1 * | 4/2008 | Quach et al. .................. 257/691 |

* cited by examiner

Primary Examiner — Benny Lee
(74) Attorney, Agent, or Firm — Jianq Chyun IP Office (57) ABSTRACT

A circuit substrate includes a first pair of ground lines, a second pair of ground lines, a plurality of first connection lines, a plurality of second connection lines and a plurality of conductive pillars. The first and second pairs of ground lines are located on first and second surfaces of the substrate, respectively. The pillars are located in the substrate and vertically conducted between the first pair of ground lines and the second connection lines and between the second pair of ground lines and the first connection lines, and the first and second pairs of ground lines are conducted, so that a 3-D grounding circuit loop is formed. Moreover, a first pair of signal lines is disposed between the first connection lines for grounding and a second pair of signal lines is disposed between the second connection lines for grounding to get a better signal integrity.

33 Claims, 6 Drawing Sheets

CIRCUIT SUBSTRATE INCLUDING A PLURALITY OF SIGNAL LINES AND GROUND LINES FORMING A 3-D GROUNDING CIRCUIT LOOP

CROSS-REFERENCE TO RELATED APPLICATION

This application claims the priority benefit of Taiwan application serial no. 99104792, filed on Feb. 12, 2010. The entirety of the above-mentioned patent application is hereby incorporated by reference herein and made a part of specification.

BACKGROUND OF THE INVENTION

1. Field of the Invention

The invention generally relates to a circuit substrate, and more particularly, to a circuit substrate having a three-dimensional (3-D) grounding circuit loop.

2. Description of Related Art

In order to maintain signal integrity and power integrity, a conventional circuit substrate for transmission of high speed signals typically adopts a full reference plane. This is done so that when an electronic signal is transmitted in a signal line, a characteristic impedance of the signal line is kept constant. A good impedance matching design between a control terminal and a device terminal is crucial to reduce the insertion loss and the return loss due to the impedance mismatch, especially when the signal is transmitted in a high speed and a high frequency environment. Accordingly, the quality of the signal transmission will not be affected.

Generally speaking, the reference plane for a high speed signal may be a power plane or a ground plane. A plurality of signal lines is disposed on a side of the reference plane, and a line width and a thickness thereof are kept constant, so that the characteristic impedance of the signal line can be kept constant. However, the size of an area occupied by the reference plane affects the wiring space available for the signal lines, especially for a double-layered circuit substrate. For this kind of circuit substrate, in order to maintain a full ground plane, signal lines can only be disposed on a single surface. Therefore, the conventional doubled-layered circuit substrate design cannot satisfy needs for high density and high speed wiring. Moreover, when an operating frequency increases, typically a terminator is employed to reduce the reflection generated in a high speed signal transmission due to impedance mismatch, so that a normal signal can be accurately and completely transmitted from one terminal of the signal line to another.

SUMMARY OF THE INVENTION

An aspect of the invention provides a circuit substrate in which signal lines and adjacent ground lines may be disposed on both sides of the circuit substrate, and a full reference plane is not required.

An aspect of the invention provides a circuit substrate capable of using a specialized ball grid array (BGA) ball pad arrangement, in which each one of the signal lines is substantially parallel to an adjacent ground line, so that the signal integrity is maintained.

An aspect of the invention provides a circuit substrate capable of achieving a low characteristic impedance for signal lines of an upper and a lower layer even when a reference plane is not available, so that a signal reflection induced by an impedance mismatch of high speed signals is reduced.

An aspect of the invention provides a circuit substrate capable of having ground lines of the upper and lower layers conductive to each other, so that a 3-D grounding circuit loop is formed.

An aspect of the invention provides a circuit substrate, including a first pair of ground lines, a second pair of ground lines, a plurality of first connection lines, a plurality of second connection lines, and a plurality of conductive pillars. The first pair of ground lines is located on a first surface of the circuit substrate. The second pair of ground lines is located on a second surface of the circuit substrate, and the second surface is opposite to the first surface. The plurality of first connection lines are located on the first surface and correspond to the second pair of ground lines. The plurality of second connection lines are located on the second surface and correspond to the first pair of ground lines. The plurality of conductive pillars are located in the circuit substrate and vertically conducted between the first pair of ground lines and the second connection lines, and vertically conducted between the second pair of ground lines and the first connection lines, so that a 3-D grounding circuit loop is formed.

According to an embodiment of the invention, the aforesaid circuit substrate further includes a first pair of signal lines and a second pair of signal lines. The first pair of signal lines is located on the first surface and located between the first connection lines electrically connected to the second pair of ground lines. The second pair of signal lines is located on the second surface, and disposed between the second connection lines electrically connected to the first pair of ground lines.

According to an embodiment of the invention, the aforesaid circuit substrate further includes a plurality of bonding pads, a first pair of power lines, and a second pair of power lines. The plurality of bonding pads are located on the first surface and arranged in an array, and the bonding pads include a first pair of signal pads, a second pair of signal pads, a first pair of ground pads, a second pair of ground pads, a first pair of power pads, and a second pair of power pads. The first pair of signal pads is respectively connected to a terminal of the first pair of signal lines, the second pair of signal pads is respectively connected to a terminal of the second pair of signal lines, the first pair of ground pads is respectively connected to a terminal of the first pair of ground lines, and the second pair of ground pads is respectively connected to a terminal of the second pair of ground lines. The first pair of power lines has a terminal respectively connected to the first pair of power pads. The second pair of power lines has a terminal respectively connected to the second pair of power pads.

According to an embodiment of the invention, the aforesaid first pair of ground pads and the second pair of ground pads are respectively located on a first line arranged on different rows and different columns of the array.

According to an embodiment of the invention, the aforesaid first pair of ground pads is located on a first row and a second row of two adjacent columns in the array, and the second pair of ground pads is respectively located on a third row and a fourth row of another two adjacent columns in the array.

According to an embodiment of the invention, the aforesaid first pair of power pads and the second pair of power pads are respectively located on a second line arranged on different rows and different columns of the array, and the second line is substantially parallel to the first line.

According to an embodiment of the invention, the aforesaid first pair of power pads is located on a first row and a second row of two adjacent columns in the array, and the second pair of power pads is respectively located on a third row and a fourth row of another two adjacent columns in the array.

According to an embodiment of the invention, the aforesaid circuit substrate further includes a third pair of signal lines and a fourth pair of signal lines. The third pair of signal lines is located on the first surface, and disposed on a side of the first connection lines electrically connected to the second pair of ground lines. The fourth pair of signal lines is located on the second surface, and disposed between the second connection lines electrically connected to the first pair of ground lines.

According to an embodiment of the invention, the aforesaid circuit substrate further includes a third pair of signal pads and a fourth pair of signal pads. The third pair of signal pads is located on the first surface, and respectively electrically connected to a terminal of the third pair of signal lines. The fourth pair of signal pads is located on the first surface, and respectively electrically connected to a terminal of the fourth pair of signal lines.

According to an embodiment of the invention, the aforesaid third pair of signal pads and the first pair of signal pads are respectively located on a first row and a second row of two adjacent columns in the array.

According to an embodiment of the invention, the aforesaid fourth pair of signal pads and the second pair of signal pads are respectively located on a third row and a fourth row of two adjacent columns in the array.

An aspect of the invention provides a circuit substrate, including a first pair of ground lines, a second pair of ground lines, a plurality of first connection lines, a plurality of second connection lines, and a plurality of conductive pillars. The first pair of ground lines is respectively located on two opposing surfaces of the circuit substrate. The second pair of ground lines is respectively located on two opposing surfaces of the circuit substrate. The plurality of first connection lines respectively correspond to the second pair of ground lines. The plurality of second connection lines respectively correspond to the first pair of ground lines. The plurality of conductive pillars are located in the circuit substrate and vertically conducted between the first pair of ground lines and the second connection lines, and vertically conducted between the second pair of ground lines and the first connection lines, so that a 3-D grounding circuit loop is formed.

According to an embodiment of the invention, the aforesaid circuit substrate further includes a first pair of signal lines and a second pair of signal lines. The first pair of signal lines is located on a surface of the circuit substrate, and disposed between the second connection lines electrically connected to the first pair of ground lines. The second pair of signal lines located on another surface of the circuit substrate, and disposed between the first connection lines electrically connected to the second pair of ground lines.

According to an embodiment of the invention, the aforesaid circuit substrate further includes a plurality of bonding pads, a first pair of power lines, and a second pair of power lines. The plurality of bonding pads are arranged in an array, and the bonding pads include a first pair of signal pads, a second pair of signal pads, a first pair of ground pads, a second pair of ground pads, a first pair of power pads, and a second pair of power pads. The first pair of signal pads is respectively connected to a terminal of the first pair of signal lines, the second pair of signal pads is respectively connected to a terminal of the second pair of signal lines, the first pair of ground pads is respectively connected to a terminal of the first pair of ground lines, and the second pair of ground pads is respectively connected to a terminal of the second pair of ground lines. The first pair of power lines has a terminal respectively connected to the first pair of power pads. The second pair of power lines has a terminal respectively connected to the second pair of power pads.

According to an embodiment of the invention, the aforesaid first pair of signal pads and the second pair of signal pads are respectively located on a first line arranged on different rows and different columns of the array.

According to an embodiment of the invention, the aforesaid first pair of signal pads is respectively located on a first row and a second row of two adjacent columns in the array, and the second pair of signal pads is respectively located on a third row and a fourth row of another two adjacent columns in the array.

According to an embodiment of the invention, the aforesaid first pair of ground pads and the first pair of power pads are alternately arranged and disposed on a second line arranged on different rows and different columns of the array, and the second line is substantially parallel to the first line.

According to an embodiment of the invention, the aforesaid first pair of ground pads is respectively located on a first row and a third row in the array, and the first pair of power pads is respectively located on a second row and a fourth row in the array.

According to an embodiment of the invention, the aforesaid second pair of ground pads and the second pair of power pads are respectively alternately arranged and disposed on a third line arranged on different rows and different columns of the array, and the third line is substantially parallel to the first line.

According to an embodiment of the invention, the aforesaid second pair of ground pads is respectively located on a first row and a third row in the array, and the second pair of power pads is respectively located on a second row and a fourth row in the array.

According to an embodiment of the invention, the aforesaid circuit substrate further includes a third pair of signal lines and a fourth pair of signal lines. The third pair of signal lines and the second pair of signal lines are located on a same surface, and the third pair of signal lines is disposed on a side of the second connection lines electrically connected to the first pair of ground lines. The fourth pair of signal lines and the first pair of signal lines are located on a same surface, and the fourth pair of signal lines is disposed on a side of the first connection lines electrically connected to the second pair of ground lines.

According to an embodiment of the invention, the aforesaid circuit substrate further includes a third pair of signal pads and a fourth pair of signal pads. The third pair of signal pads is respectively electrically connected to a terminal of the third pair of signal lines. The fourth pair of signal pads is respectively electrically connected to a terminal of the fourth pair of signal lines.

An aspect of the invention provides a circuit substrate, including a first ground line, a pair of second ground lines, a plurality of first connection lines, a second connection line, and a plurality of conductive pillars. The first ground line is located on a surface of the circuit substrate. The pair of second ground lines is respectively located on two opposing surfaces of the circuit substrate. The plurality of first connection lines respectively correspond to the pair of second ground lines. The second connection line corresponds to the first ground line. The plurality of conductive pillars are located in the circuit substrate and vertically conducted between the first ground line and the second connection line, and vertically conducted between the pair of second ground lines and the first connection lines, so that a 3-D grounding circuit loop is formed.

According to an embodiment of the invention, the aforesaid circuit substrate further includes a first pair of signal lines and a second pair of signal lines. The first pair of signal lines and the first ground line are located on a same surface, and the first pair of signal lines is disposed on a side of the first ground line. The second pair of signal lines and the first ground line are located on different surfaces, and the second pair of signal lines is disposed between the first connection lines electrically connected to the pair of second ground lines.

According to an embodiment of the invention, the aforesaid circuit substrate further includes a plurality of bonding pads, a first power line, and a pair of second power lines. The plurality of bonding pads are arranged in an array, and the bonding pads include a first pair of signal pads, a second pair of signal pads, a first ground pad, a pair of second ground pads, a first power pad, and a pair of second power pads. The first pair of signal pads is respectively connected to a terminal of the first pair of signal lines, the second pair of signal pads is respectively connected to a terminal of the second pair of signal lines, the first ground pad is connected to a terminal of the first ground line, and the pair of second ground pads is respectively connected to a terminal of the second pair of ground lines. The first power line has a terminal connected to the first power pad. The pair of second power lines has a terminal respectively connected to the pair of second power pads.

In summary, in a circuit substrate according to embodiments of the invention, a ground plane that requires a large area is replaced by a 3-D grounding circuit loop. Therefore, in order to preserve a layout space of the signal lines, the ground plane no longer needs to be disposed on a surface of the circuit substrate. Moreover, signal lines and adjacent ground lines may be disposed on both sides of the circuit substrate, and a trace width, a superposed thickness, and a trace thickness may be concurrently controlled, so that a characteristic impedance of the signal lines may be kept constant, and a single-end impedance value may be reduced. For example, a double-layered printed circuit board may have a single-end impedance value of 140 ohms lowered to 75 ohms, for use in high speed signals of DDRII-666 Mbps or above. Since the circuit substrate may be arranged with specialized BGA ball pads, where each one of the signal lines is substantially parallel to an adjacent ground line, a normal signal can be accurately and completely transmitted from one point of the signal line to another, so that a signal integrity is maintained.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
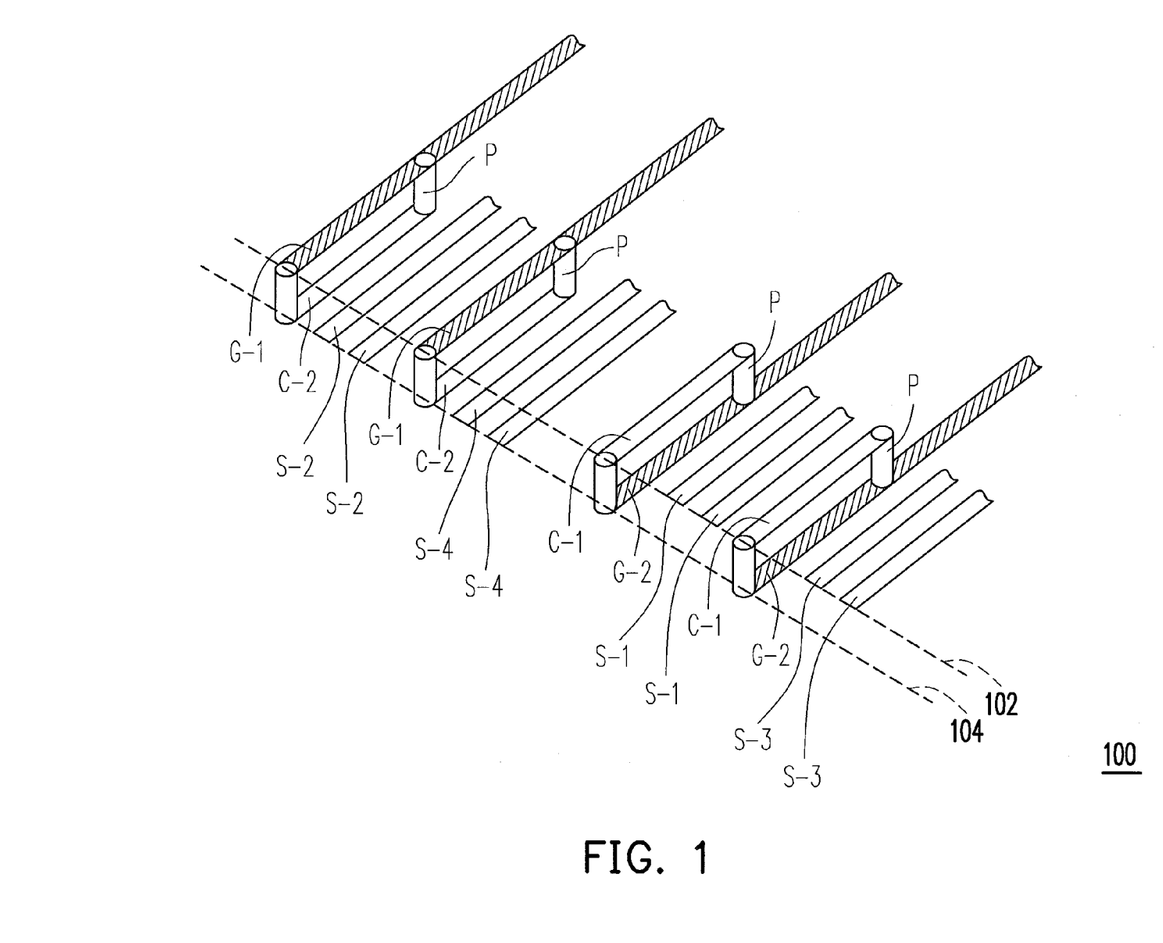
FIG. 1 is a schematic cross-sectional view of a circuit substrate structure in accordance with a first embodiment of the invention.
Figure 2:
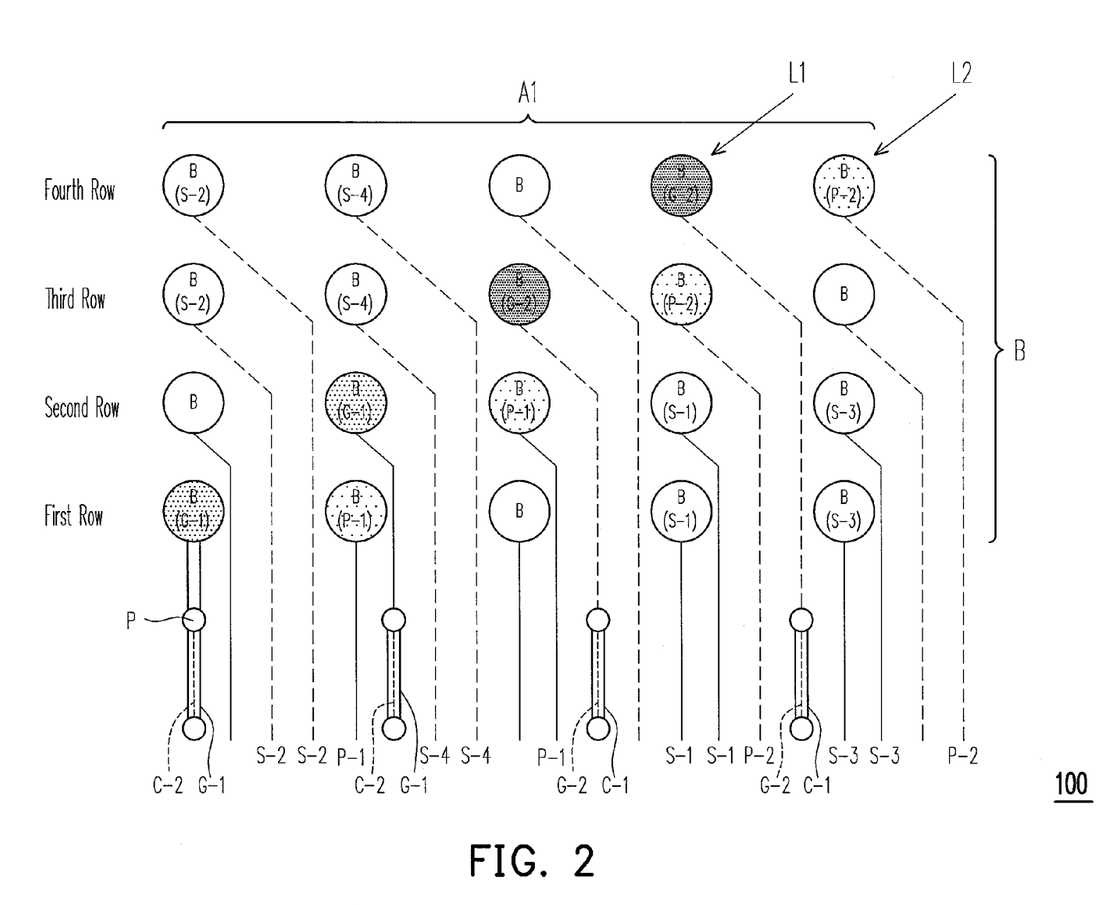
FIG. 2 is a schematic view of a layout pattern of the circuit substrate in accordance with the first embodiment of the invention.

FIG. 1 is a schematic cross-sectional view of a circuit substrate structure in accordance with a first embodiment of the invention. FIG. 2 is a schematic view of a layout pattern of the circuit substrate in accordance with the first embodiment of the invention. In the embodiments described hereafter, an unit area of a circuit layout of a circuit substrate is used as an example. The unit area is defined as the smallest unit that can be repeatedly arranged with same layout.

Referring to FIG. 1, a circuit substrate 100 includes a first pair of ground lines G-1, a second pair of ground lines G-2, a plurality of first connection lines C-1 (e.g., two lines), a plurality of second connection lines C-2 (e.g., two lines), and a plurality of conductive pillars P. The first pair of ground lines G-1 is located on a first surface 102 of the circuit substrate 100. The second pair of ground lines G-2 is located on a second surface 104 of the circuit substrate 100. In the present embodiment of the invention, the circuit substrate 100 may be a double-layered circuit substrate, and the first pair of ground lines G-1 and the second pair of ground lines G-2 are respectively located on the first surface 102 and the second surface 104, the two surfaces opposite to each other, so as to replace a conventional full reference plane. Moreover, the plurality of first connection lines C-1 are located on the first surface 102 and corresponding connect to the second pair of ground lines G-2. Moreover, the plurality of first connection lines C-2 are located on the second surface 104 and corresponding connect to the first pair of ground lines G-1. The plurality of conductive pillars P are located in the circuit substrate 100, and the pillars are vertically conducted between the first pair of ground lines G-1 and the second connection lines C-2, and vertically conducted between the second pair of ground lines G-2 and the first connection lines C-1, so that a 3-D grounding circuit loop is formed. Therefore, the circuit substrate 100 according to the present embodiment can conduct the ground lines G-1 to the ground lines G-2 to satisfy a layout requirement of a circuit.

Furthermore, in order for a characteristic impedance of each circuit line to satisfy a predetermined value, a first pair of signal lines S-1 is located on the first surface 102, and disposed between the first connection lines C-1 electrically connected to the second pair of ground lines G-2. Therefore, the first pair of signal lines S-1 is arranged substantially parallel to the adjacent first connection lines C-1, so that a signal integrity is maintained. A second pair of signal lines S-2 is located on the second surface 104, and disposed between the second connection lines C-2 electrically connected to the first pair of ground lines G-1, so that the second pair of signal lines S-2 is arranged substantially parallel to the adjacent second connection lines C-2 to maintain the signal integrity.

In the present embodiment of the invention, a third pair of signal lines S-3 is located on the first surface 102, and disposed on a side of the first connection lines C-1 electrically connected to the second pair of ground lines G-2, so that one of the signal lines S-3 (left side) is arranged substantially parallel to one of the adjacent first connection lines C-1 (right side) to maintain signal integrity. Although it is not clearly shown that one of the signal lines S-3 (right side) is arranged in parallel to one of the adjacent ground lines G-1 (left side) in FIG. 1, however, it should be noted that the layout pattern depicted in FIG. 1 is repetitious. The rightmost one of the third pair of signal lines S-3 is arranged in parallel to the leftmost one of the ground lines G-1, so that the signal integrity can be maintained. Moreover, a fourth pair of signal lines S-4 is located on the second surface 104, and disposed on a side of the second connection lines C-2 electrically connected to the first pair of ground lines G-1. Since one of the signal lines S-4 (right side) is arranged substantially parallel to one of the second pair of ground lines G-2 (left side), the signal integrity is maintained.

Referring to FIG. 2, the circuit substrate 100 includes a plurality of bonding pads B located on the first surface 102 of FIG. 1 and arranged in an array A1. Since the bonding pads B are configured to electrically connect to the BGA balls on the chip (not drawn), the bonding pads B are referred to as BGA ball pads or bonding pads for flip chip package. A number of rows for the array A1 is, for example, 4 rows (3 rows may also be suitable), with each row having 5 bonding pads, for a total of 20 bonding pads B. Among the bonding pads B, besides a first pair of ground pads B(G-1), a second pair of ground pads B(G-2), a first pair of power pads B(P-1), and a second pair of power pads B(P-2), totaling 8 bonding pads, the other 12 bonding pads are signal pads, with a ratio of approximately 12/20 among all the bonding pads B. A first pair of signal pads B(S-1) is respectively connected to a terminal of the first pair of signal lines S-1, and a second pair of signal pads B(S-2) is respectively connected to a terminal of the second pair of signal lines S-2. The first pair of ground pads B(G-1) is respectively connected to a terminal of the first pair of ground lines G-1, and the second pair of signal pads B(G-2) is respectively connected to a terminal of the second pair of ground lines G-2. Moreover, a terminal of a first pair of power lines P-1 is respectively connected to the first pair of power pads B(P-1), and a terminal of a second pair of power lines P-2 is respectively connected to the second pair of power pads B(P-2). In the present embodiment of the invention, the first pair of power lines P-1 may be selectively electrically connected to the second pair of power lines P-2 by the conductive pillars (not drawn), so that a power loop is formed. Alternatively, the first and second pairs of power lines P-1 and P-2 may be electrically connected to an external power source (not drawn). Moreover, the first and second pairs of power lines P-1 and P-2 are respectively arranged adjacent to the first pair of ground lines G-1 or the second pair of ground lines G-2, so as to completely transmit a power signal from a control terminal to a device terminal, thereby maintaining a power source integrity.

Referring to FIG. 2, the circuit substrate 100 includes a plurality of bonding pads B located on the first surface 102 and arranged in an array A1. Since the bonding pads B are configured to electrically connect to the BGA balls on the chip (not drawn), the bonding pads B are referred to as BGA ball pads or bonding pads for flip chip package. A number of rows for the array A1 is, for example, 4 rows (3 rows may also be suitable), with each row having 5 bonding pads, for a total of 20 bonding pads B. Among the bonding pads B, besides a first pair of ground pads B(G-1), a second pair of ground pads B(G-2), a first pair of power pads B(P-1), and a second pair of power pads B(P-2), totaling 8 bonding pads, the other 12 bonding pads are signal pads, with a ratio of approximately 12/20 among all the bonding pads B. A first pair of signal pads B(S-1) is respectively connected to a terminal of the first pair of signal lines S-1, and a second pair of signal pads B(S-2) is respectively connected to a terminal of the second pair of signal lines S-2. The first pair of ground pads B(G-1) is respectively connected to a terminal of the first pair of ground lines G-1, and the second pair of signal pads B(G-2) is respectively connected to a terminal of the second pair of ground lines G-2. Moreover, a terminal of a first pair of power lines P-1 is respectively connected to the first pair of power pads B(P-1), and a terminal of a second pair of power lines P-2 is respectively connected to the second pair of power pads B(P-2).

In the present embodiment of the invention, the first pair of power lines P-1 may be selectively electrically connected to the second pair of power lines P-2 by the conductive pillars (not drawn), so that a power loop is formed. Alternatively, the first and second pairs of power lines P-1 and P-2 may be electrically connected to an external power source (not drawn). Moreover, the first and second pairs of power lines P-1 and P-2 are respectively arranged adjacent to the first pair of ground lines G-1 or the second pair of ground lines G-2, so as to completely transmit a power signal from a control terminal to a device terminal, thereby maintaining a power source integrity. Besides, the first connection lines C-1, the second connection lines C-2 and the conductive pillars P in FIG. 2 can be referred to the disclosure in FIG. 1.

In the present embodiment, for aligning on the first line L1, the first pair of ground pads B(G-1) is respectively located on a first row and a second row of two adjacent columns in the array A1, and the second pair of ground pads B(G-2) is respectively located on a third row and a fourth row of another two adjacent columns in the array A1. Moreover, for aligning on the second line L2, the first pair of power pads B(P-1) is respectively located on a first row and a second row of two adjacent columns in the array A1, and the second pair of power pads B(P-2) is respectively located on a third row and a fourth row of another two adjacent columns in the array A1.

Besides the first pair of signal pads B(S-1) and the second pair of signal pads B(S-2), the circuit substrate 100 further includes a third pair of signal pads B(S-3) and a fourth pair of signal pads B(S-4). The third pair of signal pads B(S-3) is located on the first surface 102, and respectively electrically connected to a terminal of the third pair of signal lines S-3. Moreover, the fourth pair of signal pads B(S-4) is located on the first surface 102, and respectively electrically connected to a terminal of the fourth pair of signal lines S-4. In the present embodiment, the third pair of signal pads B(S-3) and the first pair of signal pads B(S-1) are respectively located on a first row and a second row of two adjacent columns in the array A1. Furthermore, the fourth pair of signal pads B(S-4) and the second pair of signal pads B(S-2) are respectively located on a third row and a fourth row of two adjacent columns in the array A1.

Figure 3:
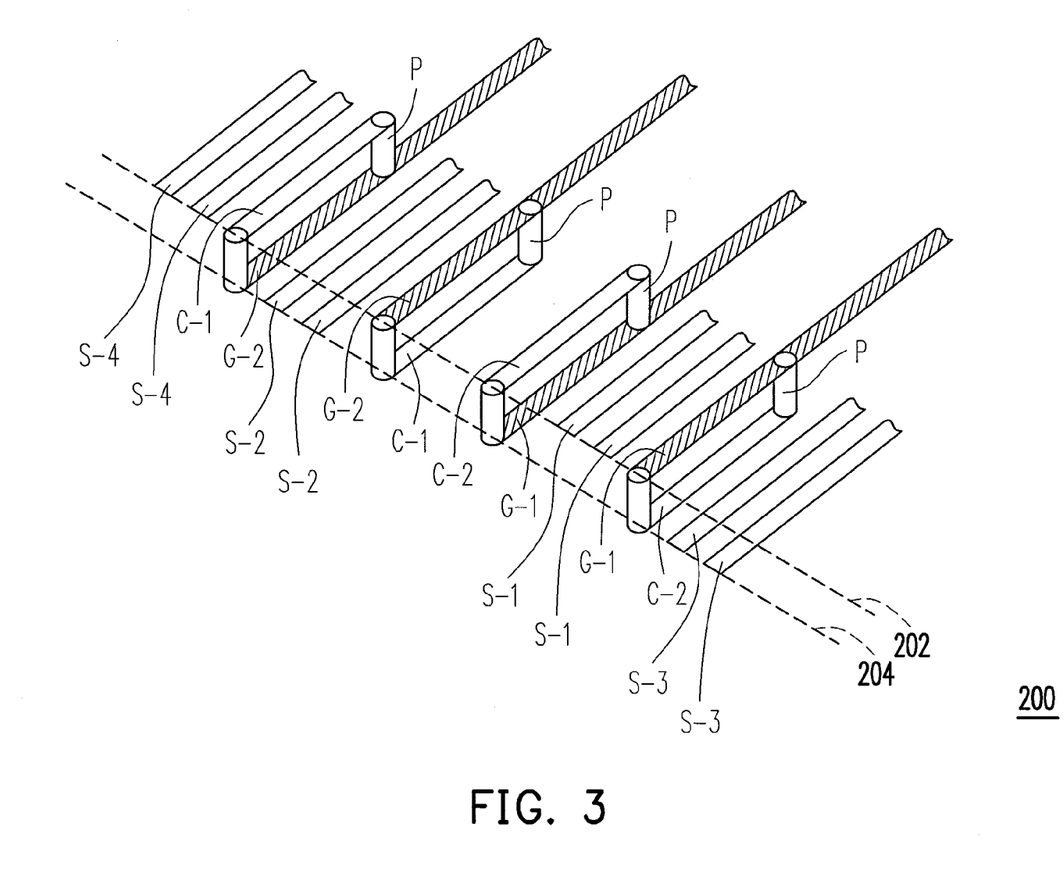
FIG. 3 is a schematic cross-sectional view of a circuit substrate structure in accordance with a second embodiment of the invention.
Figure 4:
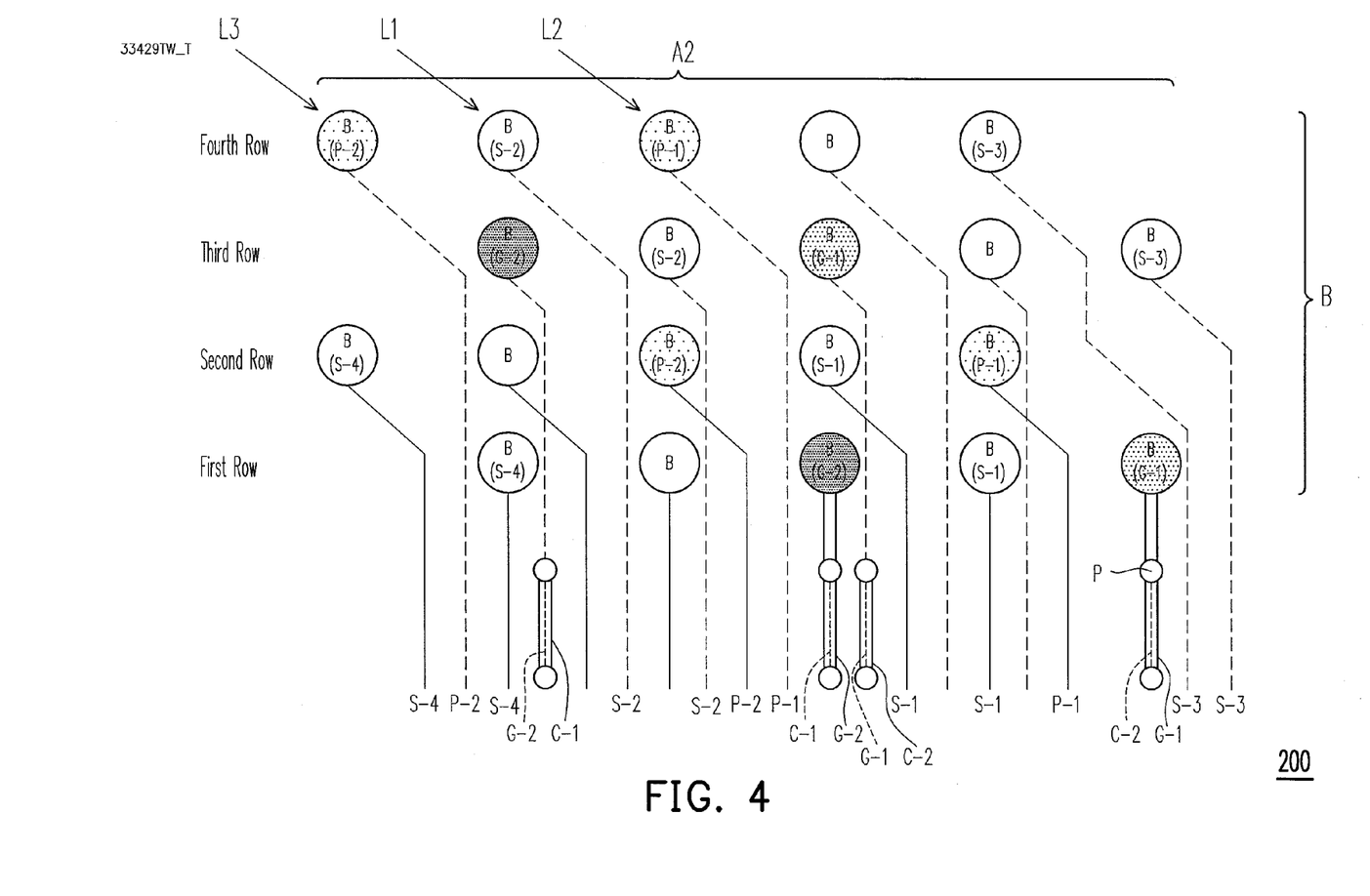
FIG. 4 is a schematic view of a layout pattern of the circuit substrate in accordance with the second embodiment of the invention.

FIG. 3 is a schematic cross-sectional view of a circuit substrate structure in accordance with a second embodiment of the invention. FIG. 4 is a schematic view of a layout pattern of the circuit substrate in accordance with the second embodiment of the invention.

Referring to FIG. 3, a circuit substrate 200 includes a first pair of ground lines G-1, a second pair of ground lines G-2, a plurality of first connection lines C-1 (e.g., two lines), a plurality of second connection lines C-2 (e.g., two lines), and a plurality of conductive pillars P. The first pair of ground lines G-1 is respectively located on two opposing surfaces 202 and 204 of the circuit substrate 200. The second pair of ground lines G-2 is respectively located on two opposing surfaces 202 and 204 of the circuit substrate 200. The plurality of first connection lines C-1 are respectively and correspondingly connected to the second pair of ground lines G-2. The plurality of second connection lines C-2 are respectively and correspondingly connected to the first pair of ground lines G-1. The plurality of conductive pillars P are located in the circuit substrate 200, and the pillars are vertically conducted between the first pair of ground lines G-1 and the second connection lines C-2, and vertically conducted between the second pair of ground lines G-2 and the first connection lines C-1, so that a 3-D grounding circuit loop is formed. Therefore, the circuit substrate 200 according to the present embodiment can conduct the ground lines G-1 to the ground lines G-2 of an upper and lower layer, so as to satisfy a layout requirement of a circuit.

Furthermore, in order for a characteristic impedance of each circuit line to satisfy a predetermined value, a first pair of signal lines S-1 is located on a surface 202 of the circuit substrate 200, and disposed between the second connection lines C-2 electrically connected to the first pair of ground lines G-1, so that the signal integrity is maintained. Moreover, a second pair of signal lines S-2 is located on another surface 204 of the circuit substrate 200, and disposed between the first connection lines C-1 electrically connected to the second pair of ground lines G-2, so that the signal integrity is maintained.

In the present embodiment of the invention, a third pair of signal lines S-3 and a second pair of signal lines S-2 are located on the same surface 204, and disposed on a side of the second connection lines C-2 electrically connected to the first pair of ground lines G-1, so that one of the signal lines S-3 (left side) is arranged substantially parallel to one of the adjacent second connection lines C-1 (right side) to maintain signal integrity. Although it is not drawn in FIG. 1 that another one of the signal lines S-3 (right side) is arranged parallel to one of the adjacent ground lines G-1, it should be noted that the layout pattern depicted in FIG. 3 is repetitious. The rightmost one of the third pair of signal lines S-3 is arranged parallel to the leftmost one of the ground lines G-2, so that the signal integrity can be maintained. Likewise, a fourth pair of signal lines S-4 and the first pair of signal lines S-1 are located on a same surface, and the fourth pair of signal lines S-4 is disposed on a side of the first connection lines C-1 electrically connected to the second pair of ground lines G-2. Due to the repeating layout pattern depicted in FIG. 3, the leftmost one of the fourth pair of signal lines S-4 is arranged parallel to the rightmost one of the ground lines G-1, so that the signal integrity can be maintained.

Referring to FIG. 4, the circuit substrate 200 includes a plurality of bonding pads B arranged in an array A2. A number of rows for the array A2 is, for example, 4 rows (3 rows may also be suitable), with each row having 5 bonding pads, for a total of 20 bonding pads B. Among the bonding pads B, besides a first pair of ground pads B(G-1), a second pair of ground pads B(G-2), a first pair of power pads B(P-1), and a second pair of power pads B(P-2), totaling 8 bonding pads, the other 12 bonding pads are signal pads, with a ratio among all the bonding pads B of approximately 12/20. A first pair of signal pads B(S-1) is respectively connected to a terminal of the first pair of signal lines S-1, and a second pair of signal pads B(S-2) is respectively connected to a terminal of the second pair of signal lines S-2. The first pair of ground pads B(G-1) is respectively connected to a terminal of the first pair of ground lines G-1, and the second pair of signal pads B(G-2) is respectively connected to a terminal of the second pair of ground lines G-2. Moreover, a terminal of a first pair of power lines P-1 is respectively connected to the first pair of power pads B(P-1), and a terminal of a second pair of power lines P-2 is respectively connected to the second pair of power pads B(P-2). In the present embodiment of the invention, the first pair of power lines P-1 may be selectively electrically connected to the second pair of power lines P-2 by the conductive pillars (not drawn), so that a power loop is formed. Alternatively, the first and second pairs of power lines P-1 and P-2 may be electrically connected to an external power source (not drawn). Moreover, the first and second pairs of power lines P-1 and P-2 are respectively arranged adjacent to the first pair of ground lines G-1 or the second pair of ground lines G-2, so as to completely transmit a power signal from a control terminal to a device terminal, thereby maintaining a power source integrity. Besides, the first connection lines C-1, the second connection lines C-2 and the conductive pillars P in FIG. 4 can be referred to the disclosure in FIG. 3.

It is worth noting that, as shown in FIG. 4, the first pair of signal pads B(S-1) and the second pair of signal pads B(S-2) are respectively located on a first line L1 arranged on different rows and different columns of the array A2. The first pair of ground pads B(G-1) and the first pair of power pads B(P-1) are alternately arranged and located on a second line L2 arranged on different rows and different columns of the array A2. In addition, the second line L2 is substantially parallel to the first line L1. The second pair of ground pads B(G-2) and the second pair of power pads B(P-2) are alternately arranged and located on a third line L3 arranged on different rows and different columns of the array A2. In addition, the third line L3 is substantially parallel to the first line L1. The first line L1 is located between the second line L2 and the third line L3.

In the present embodiment, for forming the first line L1, the first pair of signal pads B(S-1) is respectively located on a first row and a second row of two adjacent columns in the array A2, and the second pair of signal pads B(S-2) is respectively located on a third row and a fourth row of another two adjacent columns in the array A2. For forming the second line L2, the first pair of ground pads B(G-1) is respectively located on the first row and the third row in the array A2, and the first pair of power pads B(P-1) is respectively located on the second row and the fourth row in the array A2. Moreover, for forming the second line L3, the second pair of ground pads B(G-2) is respectively located on the first row and the third row in the array A2, and the second pair of power pads B(P-2) is respectively located on the second row and the fourth row in the array A2.

Besides the first pair of signal pads B(S-1) and the second pair of signal pads B(S-2), the circuit substrate 200 further includes a third pair of signal pads B(S-3) and a fourth pair of signal pads B(S-4). The third pair of signal pads B(S-3) is located on a third row and a fourth row of two adjacent columns, and respectively electrically connected to a terminal of the third pair of signal lines S-3. Furthermore, the fourth pair of signal pads B(S-4) is located on the first row and the second row of another two adjacent columns, and respectively electrically connected to a terminal of the fourth pair of signal lines S-4.

As shown in FIG. 4, one of the first pair of ground pads B(G-1) and one of the second pair of ground pads B(G-2) are respectively located on the first row and the third row of a same column. Since two ground pads B(G-1) and B(G-2) located on a same column causes two ground lines G-1 and G-2 to be arranged adjacent and substantially parallel to each other, therefore, in a third embodiment of the invention, a ground pad B(G-1) and a ground line G-1 may be omitted, and pairing is no longer required, so as to save space. Moreover, since two power pads B(P-1) and B(P-2) located on a same column causes two power lines P-1 and P-2 to be arranged adjacent and substantially parallel to each other, therefore, in the third embodiment of the invention, a power pad B(P-1) and a power line P-1 may be omitted, and pairing is no longer required.

Figure 5:
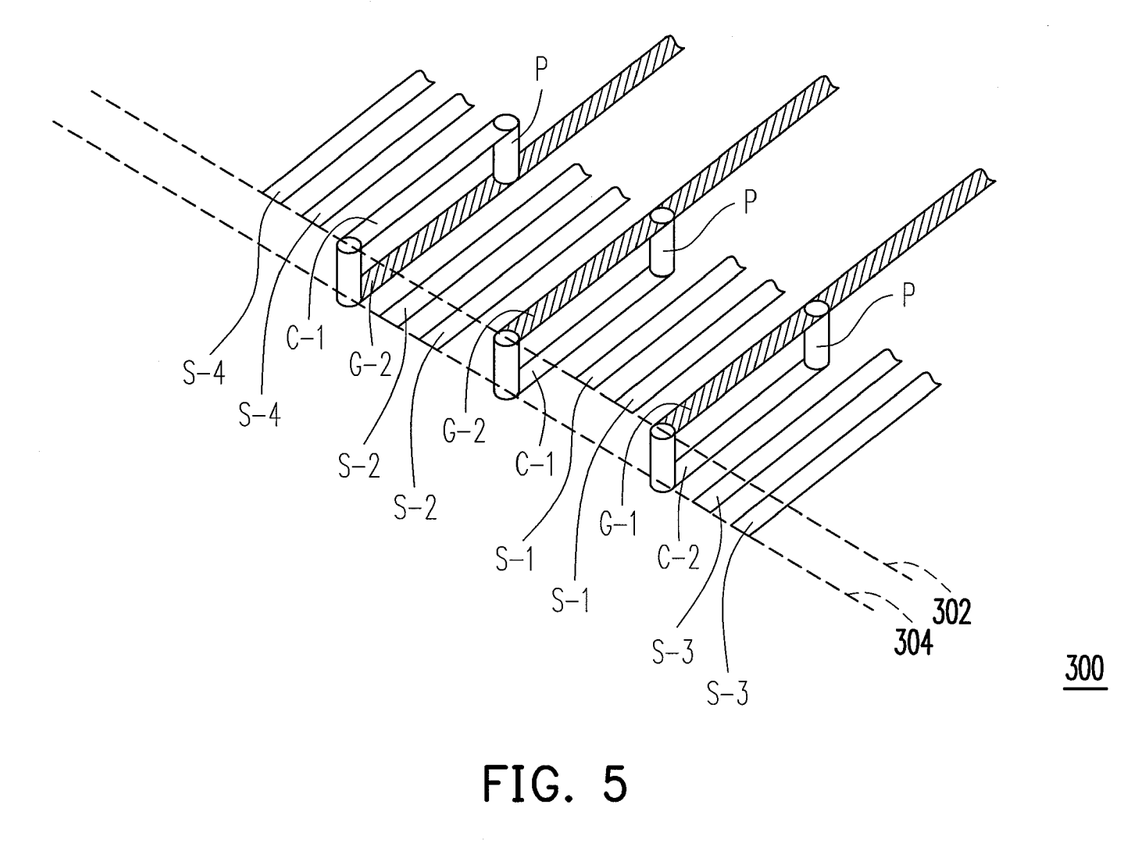
FIG. 5 is a schematic cross-sectional view of a circuit substrate structure in accordance with a third embodiment of the invention.
Figure 6:
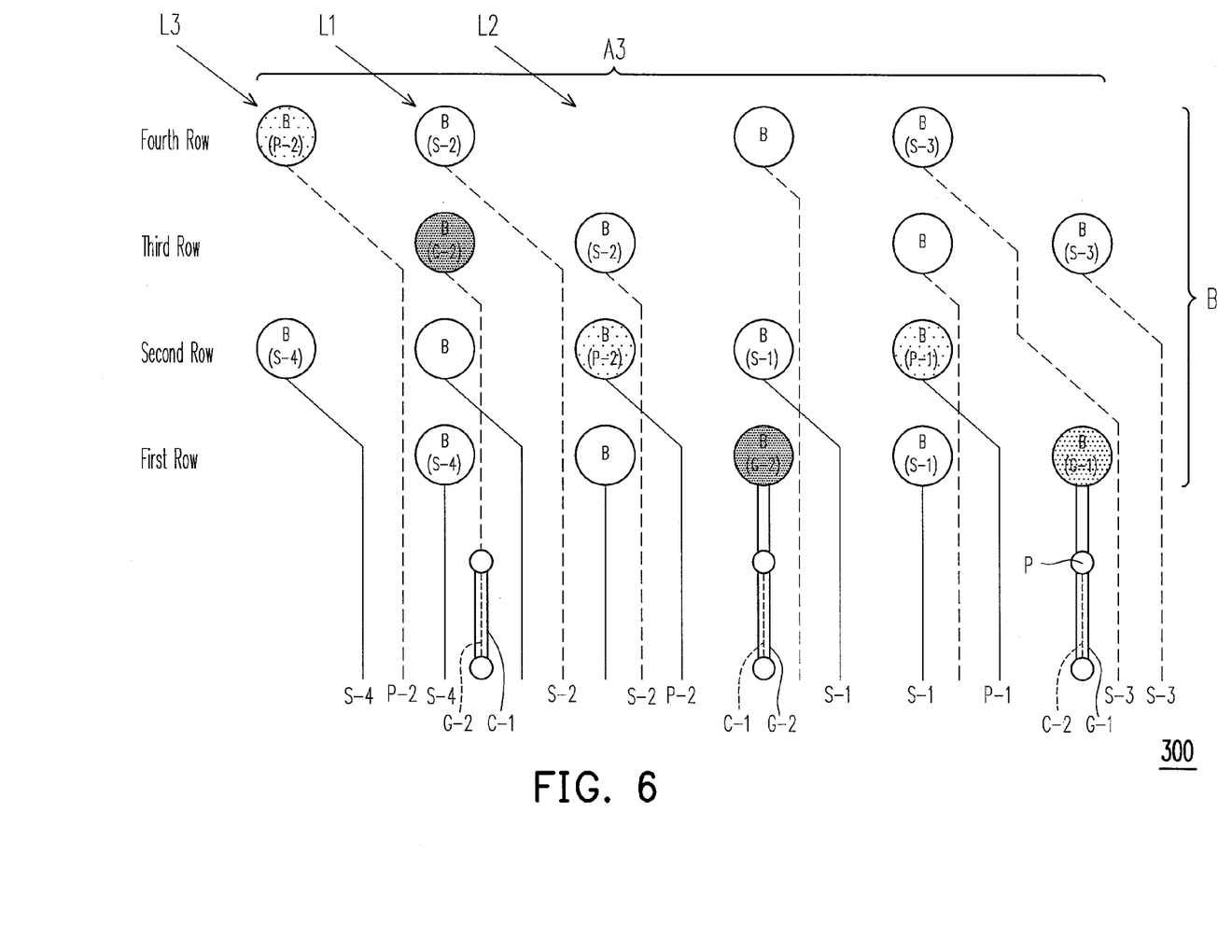
FIG. 6 is a schematic view of a layout pattern of the circuit substrate in accordance with the third embodiment of the invention.

FIG. 5 is a schematic cross-sectional view of a circuit substrate structure in accordance with the third embodiment of the invention. FIG. 6 is a schematic view of a layout pattern of the circuit substrate in accordance with the third embodiment of the invention.

Referring to FIG. 5, a circuit substrate 300 includes a first ground line G-1, a pair of second ground lines G-2, a plurality of first connection lines C-1 (e.g., two lines), a second connection line C-2, and a plurality of conductive pillars P. The first ground line G-1 is located on a surface 302 of the circuit substrate 300. The pair of second ground lines G-2 is respectively located on two opposing surfaces 302 and 304 of the circuit substrate 300. The plurality of first connection lines C-1 are respectively and correspondingly connected to the pair of second ground lines G-2. The plurality of second connection lines C-2 are respectively and correspondingly connected to the first ground line G-1. The plurality of conductive pillars P are located in the circuit substrate 300, and the pillars are vertically conducted between the first ground line G-1 and the second connection line C-2, and vertically conducted between the pair of second ground lines G-2 and the first connection lines C-1, so that a 3-D grounding circuit loop is formed to satisfy a layout requirement of a circuit. However, a difference compared to the second embodiment is that, the third embodiment of the invention merely requires a first ground line G-1 and a second connection line C-2. That is, two first ground lines G-1 and two second connection lines C-2 are not required.

Furthermore, in order for a characteristic impedance of each circuit line to satisfy a predetermined value, a first pair of signal lines S-1 is located on a surface 302 of the circuit substrate 300, and disposed on a side of the first ground line G-1, so that a signal integrity is maintained. Moreover, a second pair of signal lines S-2 is located on another surface 304 of the circuit substrate 300, and disposed between the first connection lines C-1 electrically connected to the pair of second ground lines G-2, so that the signal integrity is maintained.

As previously described for the second embodiment, a third pair of signal lines S-3 and the second pair of signal lines S-2 are located on the same surface 304, and disposed on a side of the second connection line C-2 electrically connected to the first ground line G-1. Moreover, a fourth pair of signal lines S-4 and the first pair of signal lines S-1 are located on the same surface 302, and disposed on a side of the first connection lines C-1 electrically connected to the pair of second ground lines G-2.

Referring to FIG. 6, the circuit substrate 300 further includes a plurality of bonding pads B arranged in an array A3. A number of rows for the array A2 is, for example, 4 rows (3 rows may also be suitable), with a first row having 5 bonding pads, a second row having 5 bonding pads, a third row having 4 bonding pads, and a fourth row having 4 bonding pads, for a total of 18 bonding pads B. Compared to the second embodiment, the present embodiment has two less bonding pads. Among the bonding pads B, besides a first ground pad B(G-1), a pair of second ground pads B(G-2), a first power pad B(P-1), and a pair of second power pads B(P-2), totaling 6 bonding pads, the other 12 bonding pads are signal pads, with a ratio among all the bonding pads B of 12/18, which is superior to the ratio of 12/20 according to the second embodiment of the invention. A first pair of signal pads B(S-1) is respectively connected to a terminal of the first pair of signal lines S-1, and a second pair of signal pads B(S-2) is respectively connected to a terminal of the second pair of signal lines S-2. The first ground pad B(G-1) is connected to a terminal of the first ground line G-1, and the pair of second ground pads B(G-2) is respectively connected to a terminal of the pair of second ground lines G-2. Moreover, a terminal of the first power line P-1 is connected to the first power pad B(P-1), and a terminal of a pair of second power lines P-2 is respectively connected to the pair of second power pads B(P-2). However, a difference compared to the second embodiment is that, the third embodiment of the invention merely requires a first power line P-1, so that two first power lines P-1 are not required. Besides, the first connection lines C-1, the second connection lines C-2 and the conductive pillars P in FIG.6 can be referred to the disclosure in FIG. 5.

As previously described for the second embodiment, the first pair of signal pads B(S-1) and the second pair of signal pads B(S-2) are respectively located on a first line L1 arranged on different rows and different columns of the array A3. The first ground pad B(G-1) and the first power pad B(P-1) are respectively located on a second line L2 arranged on different rows and different columns of the array A3. In addition, the second line L2 is substantially parallel to the first line L1. Moreover, the pair of second ground pads B(G-2) and the pair of second power pads B(P-2) are alternately arranged and located on a third line L3 arranged on different rows and different columns of the array A3. In addition, the third line L3 is substantially parallel to the first line L1.

As previously described for the second embodiment, the first pair of signal pads B(S-1) is respectively located on a first row and a second row of two adjacent columns in the array A3, and the second pair of signal pads B(S-2) is respectively located on a third row and a fourth row of another two adjacent columns in the array A3. The first ground pad B(G-1) and the first power pad B(P-1) are respectively located on a first row and a second row of two adjacent columns in the array A3. Moreover, the pair of second ground pads B(G-2) is respectively located on the first row and the third row in the array A3, and the second pair of power pads B(P-2) is respectively located on the second row and the fourth row in the array A3.

As previously described for the second embodiment, besides the first pair of signal pads B(S-1) and the second pair of signal pads B(S-2), the circuit substrate 300 further includes a third pair of signal pads B(S-3) and a fourth pair of signal pads B(S-4). The third pair of signal pads B(S-3) is respectively electrically connected to a terminal of the third pair of signal lines S-3. The fourth pair of signal pads B(S-4) is respectively electrically connected to a terminal of the fourth pair of signal lines S-4.

In light of the foregoing, in a circuit substrate according to embodiments of the invention broadly described herein, a grounding plane that requires a large area is replaced by a 3-D grounding circuit loop. Therefore, in order to preserve a layout space of the signal lines, the grounding plane no longer needs to be disposed on a surface of the circuit substrate. Moreover, signal lines and adjacent ground lines may be disposed on both sides of the circuit substrate, and a trace width, a superposed thickness, and a trace thickness may be concurrently controlled, so that a characteristic impedance of the signal lines may be kept constant, and a single-end impedance value may be reduced. For example, a double-layered printed circuit board may have a single-end impedance value of 140 ohms lowered to 75 ohms, for use in high speed signals of DDRII-666 Mbps or above. Since the circuit substrate may be arranged as specialized BGA ball pads, where each one of the signal lines is substantially parallel to an adjacent ground line, a normal signal can be accurately and completely transmitted from one point of the signal line to another, so that a signal integrity is maintained.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit substrate, comprising:
a first pair of ground lines located on a first surface of the circuit substrate;
a second pair of ground lines located on a second surface of the circuit substrate, the second surface opposite to the first surface;
a plurality of first connection lines located on the first surface and corresponding to the second pair of ground lines;
a plurality of second connection lines located on the second surface and corresponding to the first pair of ground lines;
a plurality of conductive pillars located in the circuit substrate and vertically conducted between the first pair of ground lines and the second connection lines, and vertically conducted between the second pair of ground lines and the first connection lines, and the first and second pairs of ground lines are conducted, so that a three-dimensional (3-D) grounding circuit loop is formed;
a first pair of signal lines located on the first surface and disposed between the first connection lines electrically connected to the second pair of ground lines;
a second pair of signal lines located on the second surface and disposed between the second connection lines electrically connected to the first pair of ground lines;
a plurality of bonding pads located on the first surface and arranged in an array, the plurality of bonding pads comprising a first pair of signal pads, a second pair of signal pads, a first pair of ground pads, a second pair of ground pads, a first pair of power pads, and a second pair of power pads, wherein the first pair of signal pads is respectively connected to a terminal of the first pair of signal lines, the second pair of signal pads is respectively connected to a terminal of the second pair of signal lines, the first pair of ground pads is respectively connected to a terminal of the first pair of ground lines, and the second pair of ground pads is respectively connected to a terminal of the second pair of ground lines;
a first pair of power lines having a terminal respectively connected to the first pair of power pads; and
a second pair of power lines having a terminal respectively connected to the second pair of power pads.

2. The circuit substrate as claimed in claim 1, wherein the first pair of ground pads and the second pair of ground pads are respectively located on a first line arranged on different rows and different columns of the array.

3. The circuit substrate as claimed in claim 2, wherein the first pair of ground pads is located on a first row and a second row of two adjacent columns in the array, and the second pair of ground pads is respectively located on a third row and a fourth row of another two adjacent columns in the array.

4. The circuit substrate as claimed in claim 2, wherein the first pair of power pads and the second pair of power pads are respectively located on a second line arranged on different rows and different columns of the array, and the second line is substantially parallel to the first line.

5. The circuit substrate as claimed in claim 4, wherein the first pair of power pads is located on a first row and a second row of two adjacent columns in the array, and the second pair of power pads is respectively located on a third row and a fourth row of another two adjacent columns in the array.

6. The circuit substrate as claimed in claim 1, further comprising:
a third pair of signal lines located on the first surface and disposed on a side of the first connection lines electrically connected to the second pair of ground lines; and
a fourth pair of signal lines located on the second surface and disposed on a side of the second connection lines electrically connected to the first pair of ground lines.

7. The circuit substrate as claimed in claim 6, further comprising:
a third pair of signal pads located on the first surface, and respectively electrically connected to a terminal of the third pair of signal lines; and
a fourth pair of signal pads located on the first surface, and respectively electrically connected to a terminal of the fourth pair of signal lines.

8. The circuit substrate as claimed in claim 7, wherein when the number of the plurality of bonding pads for each unit area of a circuit layout of the circuit substrate is 18, and the number of the first and second signal pads is 12, the ratio of the number of the first and second signal pads to the number of bonding pads is 2/3.

9. The circuit substrate as claimed in claim 7, wherein the third pair of signal pads and the first pair of signal pads are respectively located on a first row and a second row of two adjacent columns in the array.

10. The circuit substrate as claimed in claim 7, wherein the fourth pair of signal pads and the second pair of signal pads are respectively located on a third row and a fourth row of two adjacent columns in the array.

11. The circuit substrate as claimed in claim 7, wherein when the number of the plurality of bonding pads for each unit area of a circuit layout of the circuit substrate is 20, and the number of the first and second signal pads is 12, a ratio of the number of the first and second signal pads to the number of bonding pads is 3/5.

12. A circuit substrate, comprising:
a first pair of ground lines respectively located on two opposing surfaces of the circuit substrate;
a second pair of ground lines respectively located on the two opposing surfaces of the circuit substrate;
a plurality of first connection lines respectively corresponding to the second pair of ground lines;
a plurality of second connection lines respectively corresponding to the first pair of ground lines;
a plurality of conductive pillars located in the circuit substrate and vertically conducted between the first pair of ground lines and the second connection lines, and vertically conducted between the second pair of ground lines and the first connection lines, and the first and second pairs of ground lines are conducted, so that a 3-D grounding circuit loop is formed;
a first pair of signal lines located on one of the two opposing surfaces of the circuit substrate, and disposed between the second connection lines electrically connected to the first pair of ground lines;
a second pair of signal lines located on another surface of the circuit substrate, and disposed between the first connection lines electrically connected to the second pair of ground lines;
a plurality of bonding pads arranged in an array, the plurality of bonding pads comprising a first pair of signal pads, a second pair of signal pads, a first pair of ground pads, a second pair of ground pads, a first pair of power pads, and a second pair of power pads, wherein the first pair of signal pads is respectively connected to a terminal of the first pair of signal lines, the second pair of signal pads is respectively connected to a terminal of the second pair of signal lines, the first pair of ground pads is respectively connected to a terminal of the first pair of ground lines, and the second pair of ground pads is respectively connected to a terminal of the second pair of ground lines;

a first pair of power lines having a terminal respectively connected to the first pair of power pads; and a second pair of power lines having a terminal respectively connected to the second pair of power pads.

13. The circuit substrate as claimed in claim 12, wherein the first pair of signal pads and the second pair of signal pads are respectively located on a first line arranged on different rows and different columns of the array.

14. The circuit substrate as claimed in claim 13, wherein the first pair of signal pads is respectively located on a first row and a second row of two adjacent columns in the array, and the second pair of signal pads is respectively located on a third row and a fourth row of another two adjacent columns in the array.

15. The circuit substrate as claimed in claim 13, wherein the first pair of ground pads and the first pair of power pads are alternately arranged and located on a second line arranged on different rows and different columns of the array, and the second line is substantially parallel to the first line.

16. The circuit substrate as claimed in claim 15, wherein the second pair of ground pads and the second pair of power pads are alternately arranged and located on a third line arranged on different rows and different columns of the array, and the third line is substantially parallel to the first line.

17. The circuit substrate as claimed in claim 16, wherein the second pair of ground pads is respectively located on a first row and a third row in the array, and the second pair of power pads is respectively located on a second row and a fourth row in the array.

18. The circuit substrate as claimed in claim 15, wherein the first pair of ground pads is respectively located on a first row and a third row in the array, and the first pair of power pads is respectively located on a second row and a fourth row in the array.

19. The circuit substrate as claimed in claim 12, further comprising:

a third pair of signal lines located on a same surface as the second pair of signal lines, and disposed on a side of the second connection lines electrically connected to the first pair of ground lines; and a fourth pair of signal lines located on a same surface as the first pair of signal lines, and disposed on a side of the first connection lines electrically connected to the second pair of ground lines.

20. The circuit substrate as claimed in claim 19, further comprising:

a third pair of signal pads respectively electrically connected to a terminal of the third pair of signal lines; and a fourth pair of signal pads respectively electrically connected to a terminal of the fourth pair of signal lines.

21. The circuit substrate as claimed in claim 20, wherein when the number of the plurality of bonding pads for each unit area of a circuit layout of the circuit substrate is 20, and the number of signal pads is 12, a ratio of the number of signal pads to the number of bonding pads is 3/5.

22. The circuit substrate as claimed in claim 20, wherein when the number of the plurality of bonding pads for each unit area of a circuit layout of the circuit substrate is 18, and the number of signal pads is 12, the ratio of the number of signal pads to the number of bonding pads is 2/3.

23. A circuit substrate, comprising:

a first ground line located on a surface of the circuit substrate;

a pair of second ground lines respectively located on two opposing surfaces of the circuit substrate;

a plurality of first connection lines respectively corresponding to the pair of second ground lines;

a second connection line corresponding to the first ground line;

a plurality of conductive pillars located in the circuit substrate and vertically conducted between the first ground line and the second connection line, and vertically conducted between the pair of second ground lines and the first connection lines, and the first and second ground lines are conducted, so that a 3-D grounding circuit loop is formed;

a first pair of signal lines located on a same surface as the first ground line, and disposed on a side of the first ground line;

a second pair of signal lines located on a different surface as the first ground line, and disposed between the first connection lines electrically connected to the pair of second ground lines;

a plurality of bonding pads arranged in an array, the bonding pads comprising a first pair of signal pads, a second pair of signal pads, a first ground pad, a pair of second ground pads, a first power pad, and a pair of second power pads, wherein the first pair of signal pads is respectively connected to a terminal of the first pair of signal lines, the second pair of signal pads is respectively connected to a terminal of the second pair of signal lines, the first ground pad is connected to a terminal of the first ground line, and the pair of second ground pads is respectively connected to a terminal of the second pair of ground lines;

a first power line having a terminal connected to the first power pad; and a pair of second power lines having a terminal respectively connected to the pair of second power pads.

24. The circuit substrate as claimed in claim 23, further comprising:

a third pair of signal lines located on a same surface as the second pair of signal lines, and disposed on a side of the second connection line electrically connected to the first ground line; and a fourth pair of signal lines located on a same surface as the first pair of signal lines, and disposed on a side of the first connection lines electrically connected to the pair of second ground lines.

25. The circuit substrate as claimed in claim 24, further comprising:

a third pair of signal pads respectively electrically connected to a terminal of the third pair of signal lines; and a fourth pair of signal pads respectively electrically connected to a terminal of the fourth pair of signal lines.

26. The circuit substrate as claimed in claim 25, wherein when the number of the plurality of bonding pads for each unit area of a circuit layout of the circuit substrate is 18, and the number of signal pads is 12, the ratio of the number of signal pads to the number of bonding pads is 2/3.

27. The circuit substrate as claimed in claim 25, wherein when the number of the plurality of bonding pads for each unit area of a circuit layout of the circuit substrate is 20, and the number of signal pads is 12, a ratio of the number of signal pads to the number of bonding pads is 3/5.

28. The circuit substrate as claimed in claim 23, wherein the first pair of signal pads and the second pair of signal pads are respectively located on a first line arranged on different rows and different columns of the array.

29. The circuit substrate as claimed in claim 28, wherein the first ground pad and the first power pad are respectively located on a second line arranged on different rows and different columns of the array, and the second line is substantially parallel to the first line.

30. The circuit substrate as claimed in claim 29, wherein the first ground pad and the first power pad are respectively located on a first row and a second row of two adjacent columns in the array.

31. The circuit substrate as claimed in claim 29, wherein the pair of second ground pads and the pair of second power pads are alternately arranged and located on a third line arranged on different rows and different columns of the array, and the third line is substantially parallel to the first line.

32. The circuit substrate as claimed in claim 31, wherein the pair of second ground pads is respectively located on a first row and a third row in the array, and the pair of second power pads is respectively located on a second row and a fourth row in the array.

33. The circuit substrate as claimed in claim 28, wherein the first pair of signal pads is respectively located on a first row and a second row of two adjacent columns in the array, and the second pair of signal pads is respectively located on a third row and a fourth row of another two adjacent columns in the array.

* * * * *